United States Patent [19]
Liu et al.

[11] Patent Number: 5,945,705
[45] Date of Patent: Aug. 31, 1999

[54] THREE-DIMENSIONAL NON-VOLATILE MEMORY

[75] Inventors: Yowjuang W. Liu; Sameer S. Haddad, both of San Jose, Calif.

[73] Assignee: Advanced Micro Devices, Inc., Sunnyvale, Calif.

[21] Appl. No.: 08/510,118

[22] Filed: Aug. 1, 1995

[51] Int. Cl.$^6$ .................................................. H01L 29/788
[52] U.S. Cl. .......................................... 257/315; 257/330
[58] Field of Search ..................................... 257/330, 315, 257/316, 408, 332; 438/259, 242, 268, 270, 271, 257

[56] References Cited

U.S. PATENT DOCUMENTS

| | | | |
|---|---|---|---|
| 3,500,142 | 3/1970 | Kahng | 317/235 |
| 4,203,158 | 5/1980 | Frohman-Bentchkowsky et al. | 365/185 |
| 4,267,632 | 5/1981 | Shappir | 29/571 |
| 4,698,787 | 10/1987 | Mukherjee et al. | 365/185 |
| 4,698,900 | 10/1987 | Esquivel | 437/52 |
| 4,763,177 | 8/1988 | Paterson | 357/23.5 |
| 4,780,424 | 10/1988 | Holler et al. | 437/29 |
| 4,814,286 | 3/1989 | Tam | 437/27 |
| 4,849,363 | 7/1989 | Coffey et al. | 437/19 |
| 4,929,988 | 5/1990 | Yoshikawa | 357/23.5 |
| 4,964,080 | 10/1990 | Tzeng | 365/185 |
| 5,017,977 | 5/1991 | Richardson | 357/23.5 |
| 5,049,515 | 9/1991 | Tzeng | 437/43 |
| 5,053,842 | 10/1991 | Kojima . | |
| 5,073,513 | 12/1991 | Lee | 437/43 |
| 5,077,230 | 12/1991 | Woo et al. | 437/43 |
| 5,077,691 | 12/1991 | Haddad et al. | 365/218 |
| 5,087,584 | 2/1992 | Wada et al. | 437/43 |
| 5,102,814 | 4/1992 | Woo | 437/43 |
| 5,103,274 | 4/1992 | Tang et al. | 357/23.5 |
| 5,111,270 | 5/1992 | Tzeng | 357/23.5 |
| 5,120,671 | 6/1992 | Tang et al. | 437/43 |
| 5,180,680 | 1/1993 | Yang . | |

(List continued on next page.)

FOREIGN PATENT DOCUMENTS

| | | |
|---|---|---|
| 0550770A1 | 7/1993 | European Pat. Off. . |
| 0562307A3 | 9/1993 | European Pat. Off. . |
| 6-212167 | 8/1994 | Japan . |

OTHER PUBLICATIONS

Betty Prince, "Semiconductor Memories: A Handbook of Design, Manufacture, and Application", 1991, pp. 182–187, 586–608.

Seiichi Aritome et al., "Reliability Issues of Flash Memory Cells", Proceedings of the IEEE, vol. 81, No. 5, May 1993, pp. 776–788.

Shin–ichi Kobayashi et al., "Memory Array Architecture and Decoding Scheme for 3 V Only Sector Erasable DINOR Flash Memory", IEEE Journal of Solid–State Circuits, vol. 29, No. 4, Apr. 1994, pp. 454–460.

*Primary Examiner*—Olik Chaudhuri
*Assistant Examiner*—Phat X. Cao
*Attorney, Agent, or Firm*—Skjerven, Morrill, MacPherson, Franklin & Friel; Edward C. Kwok

[57] ABSTRACT

A strip of a semiconductor material (for example, P type silicon) is oxidized and the resulting strip of oxide is removed leaving a depression in the upper surface of the semiconductor material which has steep sidewalls. The steep sidewalls do not have significant ion impact damage because they are formed by oxidation and not by reactive ion etching of the semiconductor material. A high quality tunnel oxide can therefore be grown on the steep sidewalls. Floating gates are then formed on the tunnel oxide, corresponding word lines are formed over the floating gates, a conductive region (for example, N type silicon) is formed into the bottom of the depression, and a number of conductive regions (for example, N type silicon) corresponding with the floating gates are formed above the rim of the depression. The resulting bit transistors have channel regions which extend in a vertical dimension under floating gates along the surface of the sidewall. Because the depth and profile of the depression is determined primarily by oxidation and not by lithography, very small geometry bit transistors can be made.

11 Claims, 11 Drawing Sheets

U.S. PATENT DOCUMENTS

| | | | |
|---|---|---|---|
| 5,196,722 | 3/1993 | Bergendahl et al. | 257/304 |
| 5,235,544 | 8/1993 | Caywood | 365/185 |
| 5,245,570 | 9/1993 | Fazio et al. | 365/185 |
| 5,245,572 | 9/1993 | Kosonocky et al. | 365/189.02 |
| 5,250,830 | 10/1993 | Yagishita et al. . | |
| 5,258,634 | 11/1993 | Yang | 257/316 |
| 5,268,319 | 12/1993 | Harari | 437/43 |
| 5,289,026 | 2/1994 | Ong | 257/316 |
| 5,293,328 | 3/1994 | Amin et al. | 365/185 |
| 5,297,082 | 3/1994 | Lee | 365/185 |
| 5,301,150 | 4/1994 | Sullivan et al. | 365/185 |
| 5,329,487 | 7/1994 | Gupta et al. | 365/185 |
| 5,338,953 | 8/1994 | Wake | 267/316 |
| 5,343,063 | 8/1994 | Yuan et al. | 257/317 |
| 5,350,937 | 9/1994 | Yamazaki et al. . | |
| 5,365,082 | 11/1994 | Gill et al. | 257/374 |
| 5,371,030 | 12/1994 | Bergemont | 437/52 |
| 5,378,909 | 1/1995 | Chang et al. | 257/316 |
| 5,379,255 | 1/1995 | Shah | 365/185 |
| 5,386,388 | 1/1995 | Atwood et al. | 365/201 |
| 5,390,146 | 2/1995 | Atwood et al. | 365/185 |
| 5,399,516 | 3/1995 | Bergendahl et al. | 437/43 |
| 5,399,917 | 3/1995 | Allen et al. | 327/436 |
| 5,402,370 | 3/1995 | Fazio et al. | 365/185 |
| 5,402,371 | 3/1995 | Ono | 365/185 |
| 5,402,374 | 3/1995 | Tsuruta et al. | 365/185 |
| 5,406,529 | 4/1995 | Asano | 365/230.03 |
| 5,408,115 | 4/1995 | Chang | 257/324 |
| 5,460,988 | 10/1995 | Hong | 257/315 |

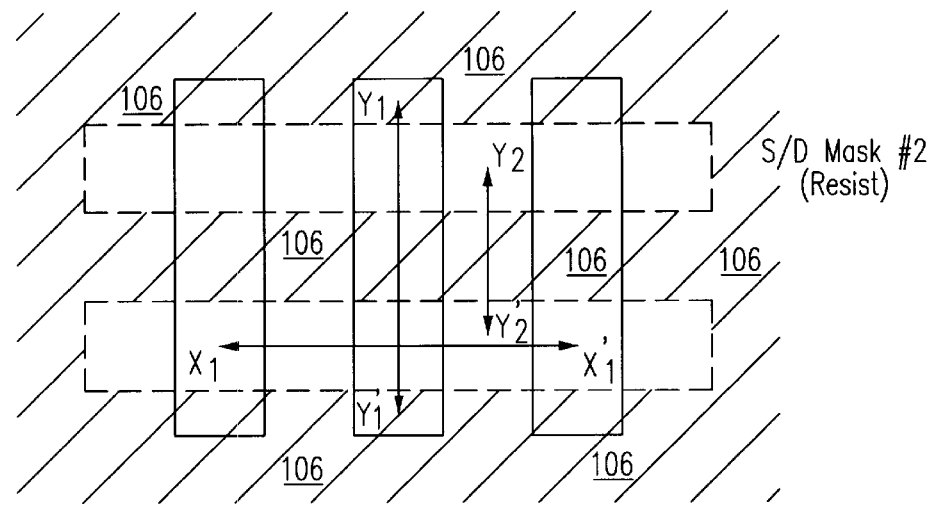
FIG. 7
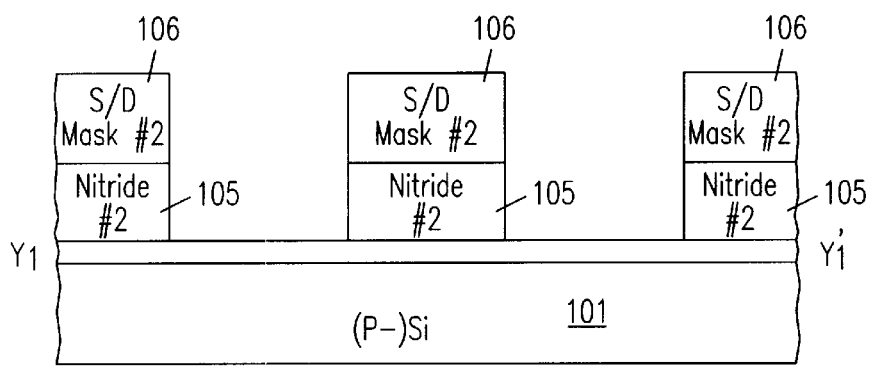
FIG. 8
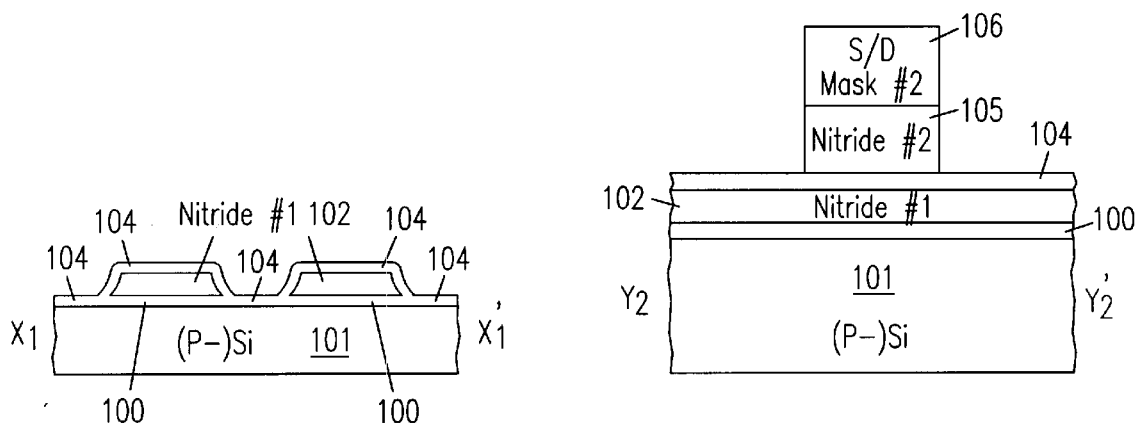
FIG. 9
FIG. 10

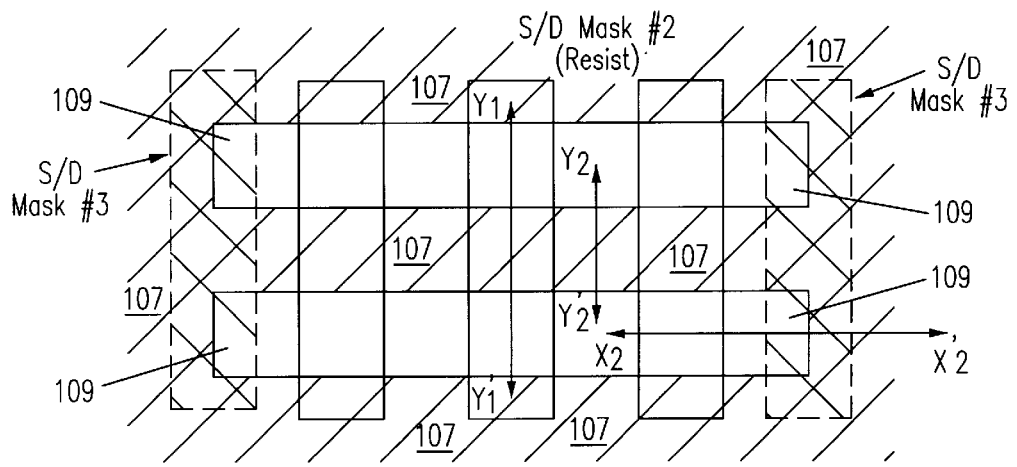
FIG. 11
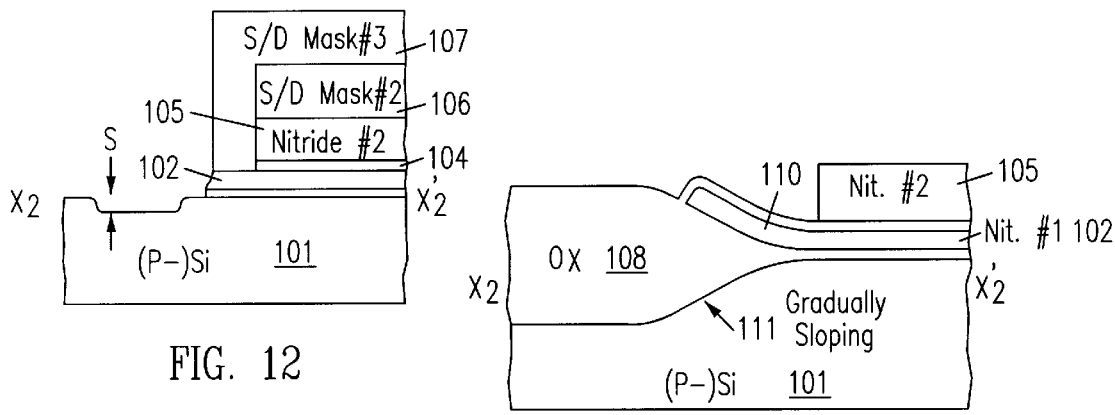
FIG. 12
FIG. 13
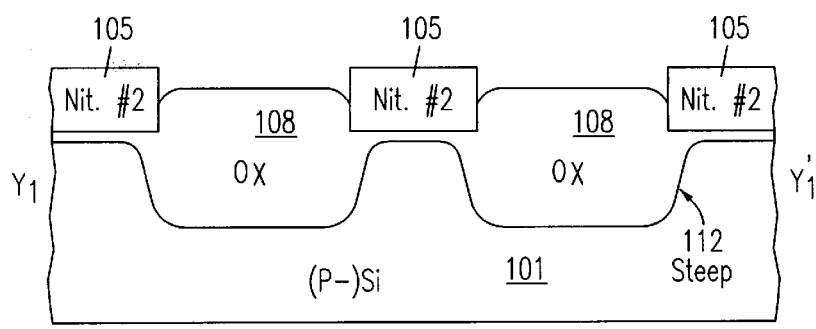
FIG. 14

THREE-DIMENSIONAL NON-VOLATILE MEMORY

FIELD OF THE INVENTION

This invention relates to non-volatile memory structures. More particularly, this invention relates the flash memory structures.

BACKGROUND INFORMATION

FIG. 1 (Prior Art) is a circuit diagram of a portion of a conventional non-volatile memory 1 called a "flash" memory. FIG. 2 (Prior Art) is a simplified top down diagram of the flash memory. Flash memory 1 has several bit transistors. The bit transistor 2 at the intersection of vertically extending metal bit line BL1 and horizontally extending word line WL2 is depicted in cross-section in FIGS. 3 and 4 (Prior Art). As shown in FIGS. 3 and 4, bit transistor 2 has a floating gate FG which is insulated from the overlying word line WL2 and metal bit line BL1. The rectangular cross-hatched features in FIG. 2 represent floating gates.

If, for example, floating gate FG is sufficiently "discharged" of electrons, then coupling the word line WL2 to a sufficiently positive potential (for example, 5.0 volts) will produce an adequately large electric field in the underlying silicon to cause a conductive channel to form between N type region 3 and N type region 4. If, on the other hand, floating gate FG is sufficiently "charged" with electrons, then coupling the word line WL2 to the sufficiently positive potential will not produce an adequately large electric field to cause a conductive channel to form between N type region 3 and N type region 4.

Accordingly, the second word of bits of flash memory 1 is read by driving word line WL2 with a positive voltage (for example, 5.0 volts) and by grounding the other word lines. Those bit transistors in the second word, the floating gates of which are discharged, are then conductive whereas the other bit transistors in the second word are not conductive. Each one of the bit lines BL1 through BLX+1 is driven with a positive voltage (such as 1.0 volts) and the current flowing through the bit line is sensed. If the bit line current is greater than 10 microamperes (for example, 100 microamperes), then the corresponding bit transistor in the selected word is determined to be conductive (i.e. "discharged"). If, on the other hand, the bit line current is less than 10 microamperes, then the corresponding bit transistor in the selected word is determined to be non-conductive (i.e. "charged"). The information content of each bit of the second word is read in this manner.

The flash memory 1 is "erased" of information by discharging all the floating gates at once (hence the term "flash"). Flash memory 1 is then "programmed" with information by charging selected ones of the floating gates and thereby leaving the other floating gates discharged. Discharging occurs by a phenomenon called "Fowler-Nordheim tunneling" whereas charging occurs by a phenomenon called "hot electron injection". See the following documents for further background information on Fowler-Nordheim tunneling, hot electron injection, and flash memory structures: U.S. Pat. No. 5,077,691 entitled "Flash EEPROM Array With Negative Gate Voltage Erase Operation; U.S. Pat. No. 4,698,787 entitled "Single Transistor Electrically Programmable Memory Device And Method; "Semiconductor Memories" by B. Prince, published by John Wiley & Sons, pages 183–187 and 586–608 (1983); "Memory Array Architecture and Decoding Scheme for 3 V Only Sector Erasable DINOR Flash Memory" by S. Kobayashi et al., IEEE Journal of Solid-State Circuits, Vol. 29, No. 4, pages 454–460 (1994); and "Reliability Issues of Flash Memory Cells" by S. Aritome et al., Proceedings of the IEEE, Vol. 81, No. 5, pages 776–788 (1993). The subject matter of these documents is incorporated herein by reference.

Although such conventional flash memories function satisfactorily, ever more dense flash memory integrated circuits are sought. It is therefore desirable to make the individual bit transistors smaller and smaller. To decrease bit transistor geometries below about 0.25 microns (bit transistor gate length), however, advanced lithography tools including advanced steppers will likely be required. These tools are still being developed and are very expensive. It therefore is desirable to make smaller geometry bit transistors without using these advanced lithography tools.

SUMMARY

A strip of a semiconductor material (for example, P type silicon) is oxidized and the resulting strip of oxide is removed leaving a depression in the upper surface of the semiconductor material which has steep sidewalls. Floating gates are then formed over and along the steep sidewalls and corresponding word lines are formed over the floating gates. A conductive region (for example, N type silicon) is formed in the bottom of the depression and a number of conductive regions (for example, N type silicon) corresponding with the floating gates is formed outside the rim of the depression. Bit transistors are thereby formed having channel regions which extend in a vertical dimension under floating gates along the vertical surface of the depression sidewall from the conductive region at the bottom of the depression to respective ones of the conductive regions outside the depression.

Because the length of the floating gates is determined by the depth and sidewall profile of the depression, and because the depth and profile of the depression is determined primarily by oxidation and processing and not by lithography, very small geometry bit transistors can be made. Moreover, the vertical orientation of the floating gates on the sidewalls of the depression conserves silicon area and therefore facilitates still greater memory densities.

Because the depression is formed by oxidation and not by the direct etching of the semiconductor material with reactive ion etching, the semiconductor sidewall surface does not have significant ion impact damage. As a result, a high quality thin tunnel oxide can be grown on the sidewall surface so that the floating gates are well insulated from the underlying sidewall surface.

This summary does not purport to define the invention. The invention is defined by the appended claims.

BRIEF DESCRIPTION OF THE DRAWINGS

FIGS. 5–38 illustrate methods of fabricating a "flash" memory structure in accordance with the present invention.

DETAILED DESCRIPTION OF THE PREFERRED EMBODIMENTS

Figure 1:
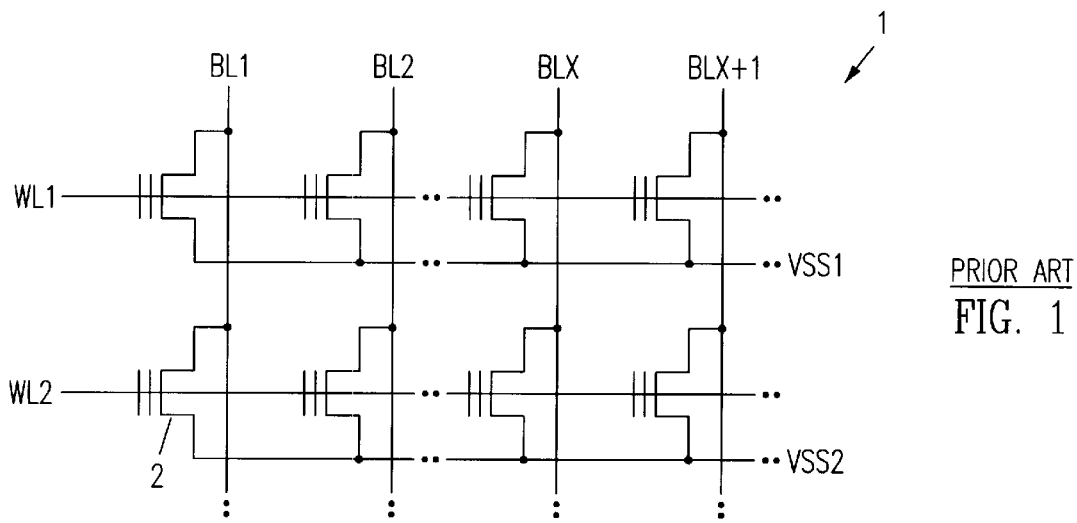
FIGS. 1–4 (Prior Art) illustrate a conventional "flash" memory.
Figure 2:
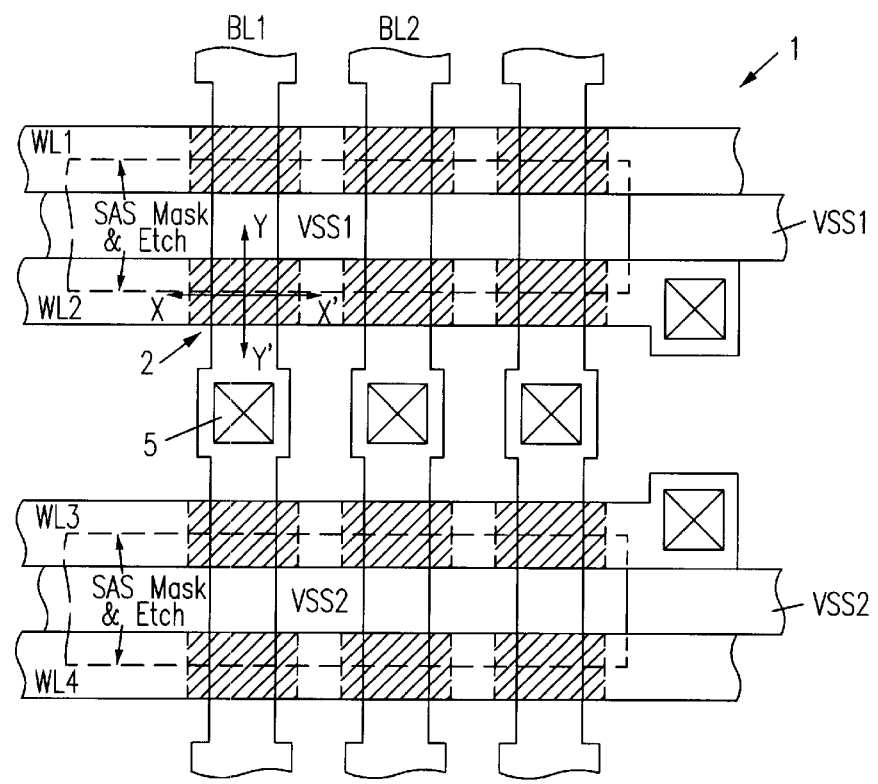
Figure 3:
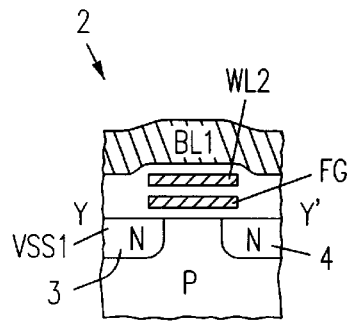
Figure 4:
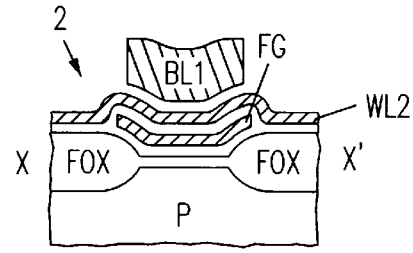

FIGS. 5–38 illustrate the fabrication of a flash memory structure in accordance with the present invention. The subject matter of U.S. Pat. No. 5,672,524, entitled 'THREE-DIMENSIONAL COMPLEMENTARY FIELD EFFECT TRANSISTOR PROCESS AND STRUCTURES", filed on the same day as the present disclosure, is expressly incorporated herein by reference.

First, a thin oxide 100 is grown over the entire upper surface of a P– type semiconductor material 101 and a thin nitride layer 102 (referred to in the drawings as "nitride #1") is deposited on the thin oxide. The thin oxide has a thickness is the range of approximately 50–500 angstroms and the thin nitride layer has a thickness in the range of approximately 50–1000 angstroms. The P– type semiconductor material may, for example, be either substrate silicon or epitaxial silicon. In the illustrated embodiment, the P– type semiconductor material is substrate silicon having a doping concentration in the range of approximately 1E13 atoms/cm$^3$ to 1E16 atoms/cm$^3$.

Figure 5:
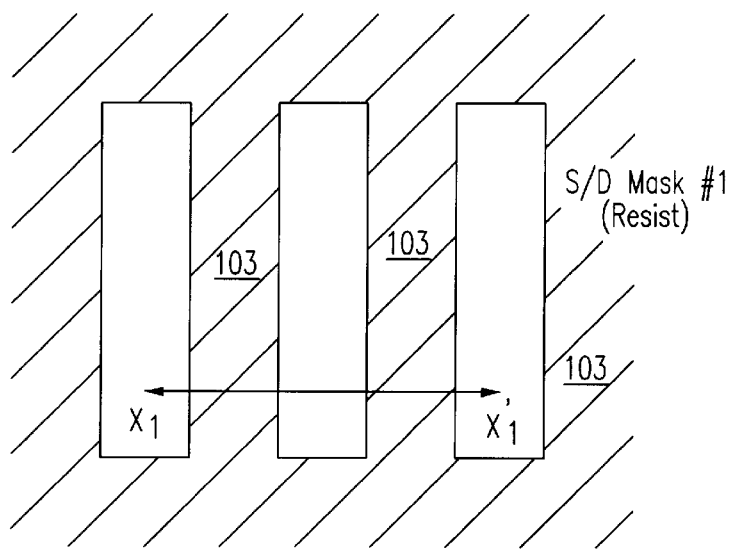
Figure 6:
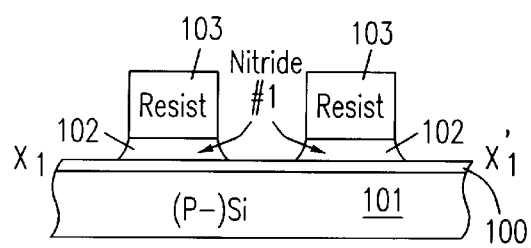

A first source/drain mask 103 (referred to in the drawings as "S/D mask #1") of photoresist is then formed having elongated parallel openings as shown in FIG. 5. An isotropic nitride etch is then performed to obtain 50° to 60° thin nitride side-edge profiles. FIG. 6 is a cross-sectional diagram taken along line $x_1$-$x_1'$ on FIG. 5 showing the resulting openings in the thin nitride layer.

An oxide dip is then performed to remove thin oxide from the exposed openings. The source/drain mask #1 is then removed. A layer of oxide 104 (FIG. 9) is then formed over the remaining thin nitride and the exposed surface of the semiconductor material. Any suitable oxidation step may be used including a TEOS deposition step, an LTO (low temperature oxide) deposition step or an HTO (high temperature oxide) deposition step. The layer of oxide 104 has a thickness in the approximate range of 50–500 angstroms and preferably has a thickness of approximately 250 angstroms.

A thick layer of nitride 105 (referred to in the drawings as "nitride #2") is then deposited over the entire structure. This thick layer of nitride has a thickness in the approximate range of 1000–3000 angstroms and has a preferred thickness of approximately 2000 angstroms.

Next, a second source/drain mask 106 (referred to in the drawings as "S/D mask #2") of photoresist is formed as is shown in FIG. 7. An isotropic nitride etch is then performed to remove those portions of the thick nitride layer 105 exposed by the openings of the second source/drain mask 106. FIGS. 8–10 are cross-sectional diagrams taken along lines $y_1$-$y_1'$, $x_1$-$x_1'$ and $y_2$-$y_2'$ in FIG. 7, respectively.

Without removing second source/drain mask 106, a third source/drain mask 107 (referred to in the drawings as "S/D mask #3") of photoresist is formed as is shown in FIG. 11. All oxide and thin nitride which is not protected by either the second or third source/drain masks is then removed from the underlying semiconductor material. The result is two horizontally extending rectangular strips of exposed P– type silicon.

FIG. 12 is a cross-sectional diagram showing the resulting structure along line $x_2$-$x_2'$ of FIG. 11. If anisotropic nitride etching is used, a slanted thin nitride side-edge profile is obtained. A silicon step may also be obtained as illustrated by arrows S in FIG. 12 due to the finite nitride-to-silicon selectivity (20:1 to 50:1) of the nitride etch. Etching into the semiconductor material 101 occurs in areas which were not covered by nitride at the beginning of the nitride etching step. The silicon step may be between 5 and 100 angstroms and most likely is about 25 angstroms. A silicon etch can optionally also be performed here in the process to increase effective floating gate length in the final bit transistors.

After a photoresist removal step is performed to remove the second and third source/drain masks 106 and 107, a high temperature thick oxidation step is performed to grow a thick oxide 108 on the elongated rectangular exposed strips of the upper surface of semiconductor material 101 which is not covered by nitride. In some embodiments, a high temperature dry thermal oxidation process is used as set forth in U.S. Pat. No. 5,155,381. The subject matter of U.S. Pat. No. 5,155,381 is incorporated herein by reference. Thick oxide 108 has a thickness in a range of approximately 1500–6000 angstroms and has an preferred thickness of approximately 3000 angstroms.

FIG. 13 is a simplified cross-sectional diagram showing thick oxide 108 along the line $x_2$-$x_2'$ of FIG. 11. FIG. 14 is a simplified cross-sectional diagram showing thick oxide 108 along the line $y_1$-$y_1'$ of FIG. 11. Note the different shapes of the bird's beaks of thick oxide layer 108 in FIGS. 13 and 14. The long and thin beams 110 of thin nitride in regions 109 shown in cross-section in FIG. 13 allow thick oxide 108 to lift and bend beams 110 so that a relatively gradually sloping oxide 108 to semiconductor 101 boundary 111 is formed. Making the beams 110 of thin nitride as opposed to thick nitride makes the beams easier to bend. Making the beams 110 longer as opposed to shorter gives the oxide an additional mechanical advantage in bending the beams.

The relatively thick nitride layer 105, on the other hand, is more difficult to bend and lift. Consequently, the oxide 108 to semiconductor material 101 boundary 112 in FIG. 14 is relatively steep as compared with the gradually sloping boundary 111 of FIG. 13.

Figure 15:
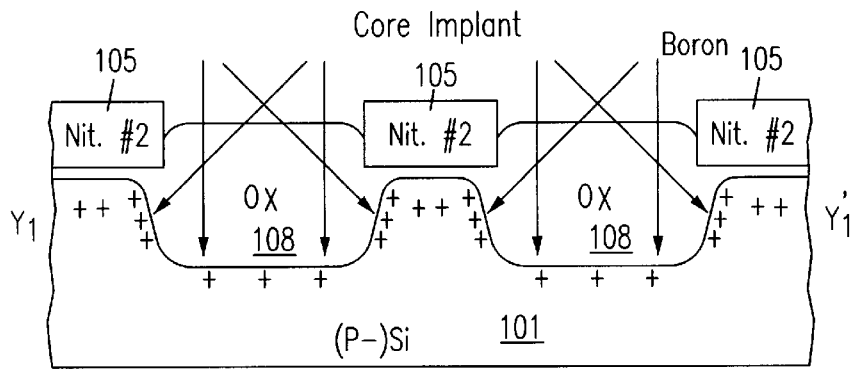

Next, a core implant step is performed as illustrated in FIG. 15. In some embodiments, boron is implanted with a dose in the range of approximately 1E13 atoms/cm$^2$ to 5E14 atoms/cm$^2$ and an implant energy in the approximate range of 50–300 KeV. In a preferred embodiment, a boron dose of approximately 5E13 atoms/cm$^2$ is implanted with an implant energy of approximately 100 KeV. A large angle twist and tilt implant technique is preferred and is illustrated in FIG. 15.

Figure 16:
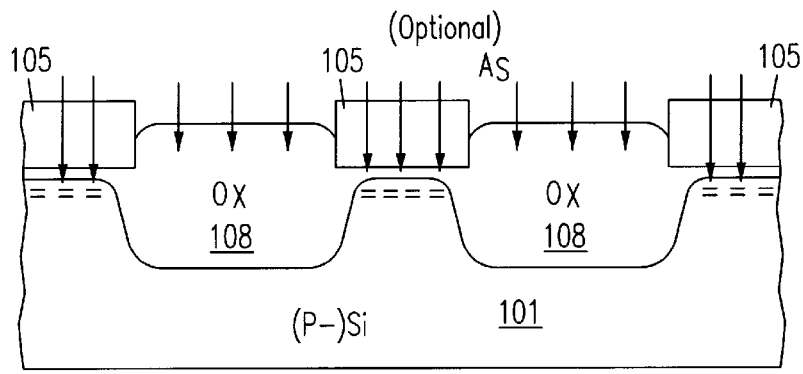

An optional source/drain implant step may then be performed as illustrated in FIG. 16. Arsenic may be implanted with a dose in the range of approximately 1E15 atoms/cm$^2$ to 1E16 atoms/cm$^2$ with an implant energy in the range of approximately 300–500 KeV. Arsenic is preferably implanted with a dose of approximately 3E15 atoms/cm$^2$ with an implant energy of 400 KeV. If doubly ionized arsenic is used, an implant energy of 200 KeV is preferred. Performing this source/drain implant at this point in the process alleviates the need to perform a source/drain implant later in the process when the tunnel oxide is present. Accordingly, the tunnel oxide to be formed later in the process is not subjected to damage to which it otherwise would be subjected were a source/drain implant performed later.

Figure 17:
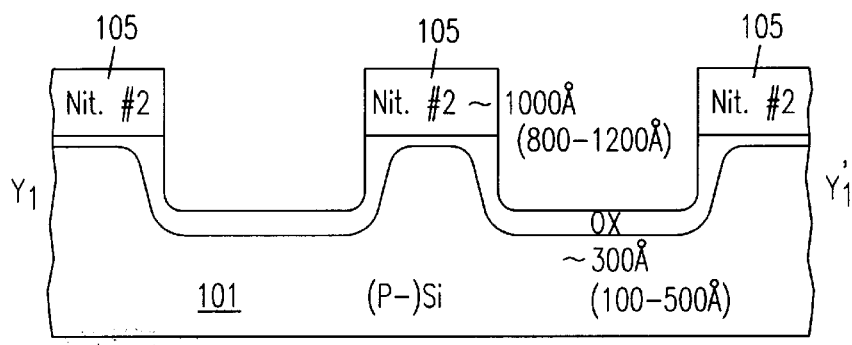

A thick oxide etch back step is then performed as illustrated in FIG. 17. In some embodiments, reactive ion etching of the oxide is used to achieve anisotropic etching. A typical oxide-to-nitride selectivity of 3:1 is used meaning that oxide is etched three times faster than nitride. Approximately 1000 angstroms of the thick oxide 108 is removed leaving approximately 300 angstroms of the thick oxide covering semiconductor material 101 in the bottom of the etch depression.

Figure 18:
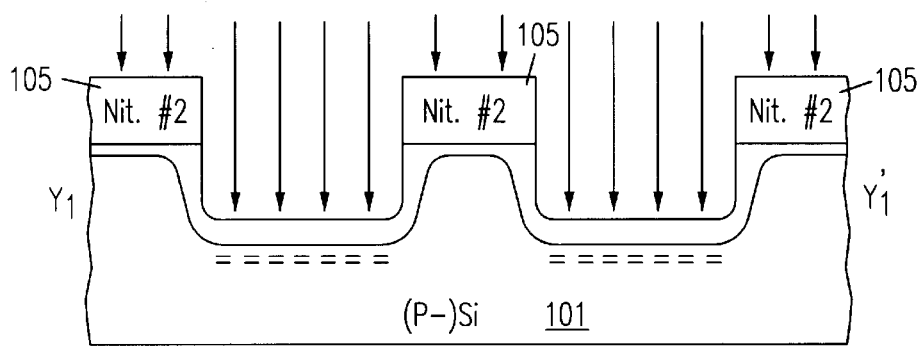

Next, a VSS source implant step is performed as illustrated in FIG. 18 to dope the semiconductor material 101 at the bottom of the thick oxide etch depression. In some embodiments, arsenic is implanted with a dose in the range of approximately 1E15 atoms/cm² to 1E16 atoms/cm² and an implant energy in the range of approximately 30–150 KeV. In a preferred embodiment, arsenic is implanted with a dose of approximately 5E15 atoms/cm² and an implant energy of approximately 80 KeV. In other embodiments, boron is implanted with a dose in the range of approximately 1E15 atoms/cm² to 1E16 atoms/cm² and an implant energy in the range of approximately 20–70 KeV. In a preferred embodiment, boron is implanted with a dose of approximately 5E15 atoms/cm² and an implant energy of approximately 50 KeV.

A nitride etch is then performed to remove all remaining nitride. A nitride-to-oxide selectivity of 3:1 is used to stop etching on the oxide which overlies thin nitride 102.

Figure 19:
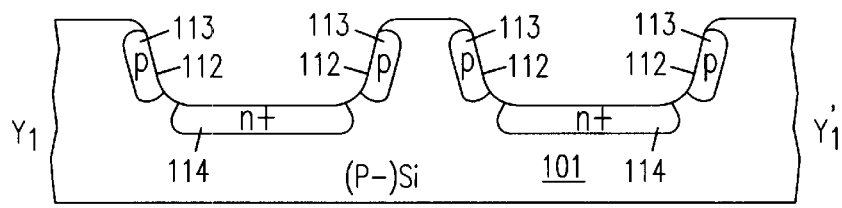
Figure 20:
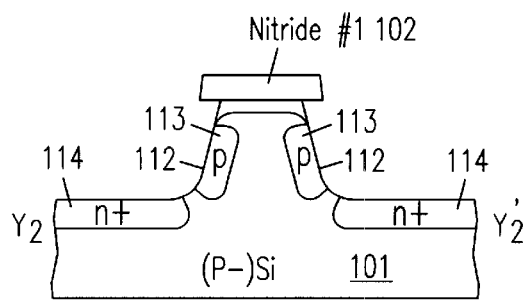
Figure 21:
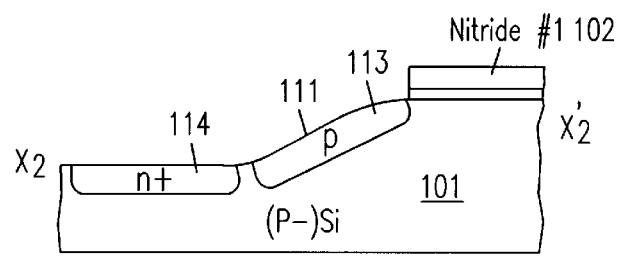

A wet oxide etch is then performed to remove all thin oxide 100 and thick oxide 108 which is not disposed underneath thin nitride. The result is two depressions. Each of the depressions has two opposing, long, parallel and steep sidewalls and two opposing, short, parallel and gradually sloping sidewalls. The depressions have long and relatively flat bottom surfaces. FIGS. 19–21 are cross-sectional diagrams of the resulting structure taken along lines $y_1$-$y_1'$, $y_2$-$y_2'$ and $x_2$-$x_2'$ of FIG. 11, respectively. The P type dopants which were implanted in the core implant step illustrated in FIG. 15 form P type regions 113. The N type dopants which were implanted in the VSS source implant step illustrated in FIG. 18 form elongated N+ type regions 114 extending into the semiconductor material in the bottom of the depressions.

Because the depressions are formed by oxidizing semiconductor material and then removing the resulting oxide and not by directly removing the semiconductor material by ion impact assisted etching, the sidewalls of the depressions do not have significant ion impact damage (the ion implant doping steps do not significantly damage the sidewalls like reactive ion etching of the semiconductor material would). Accordingly, a high quality thin tunnel oxide can be grown on the sidewalls.

An oxidation step is therefore performed to form a thin layer 115 of tunnel oxide on the sidewalls of the depressions and all other surfaces of semiconductor material 101 not covered by thin nitride 102. The tunnel oxide 115 may, for example, be 50–200 angstroms thick. After the oxidation step, a polysilicon layer (referred to as "poly1" in the drawings) is then deposited over the entire structure and is etched. The result is a spacer-like strip of polysilicon disposed over and along each corresponding steep sidewall 112 of the depressions over the tunnel oxide 115. The etching removes the polysilicon from the gradually sloping sidewalls 111 of the depressions.

Figure 22:
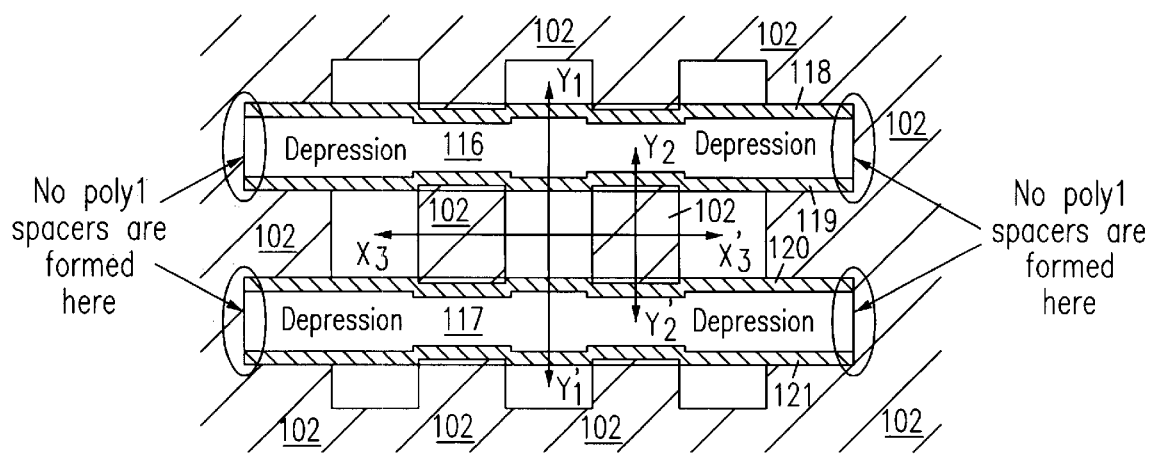
Figure 23:
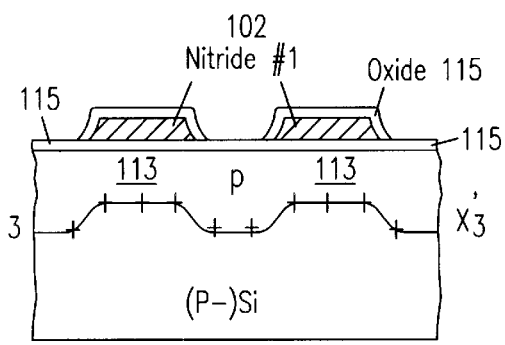
Figure 24:
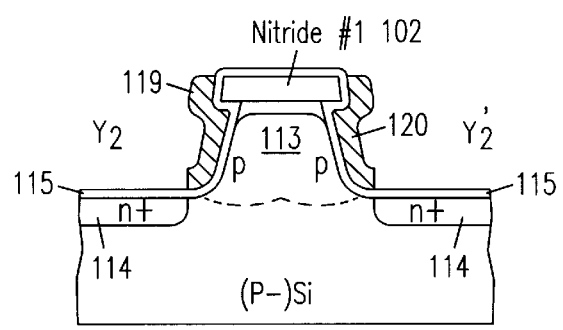
Figure 25:
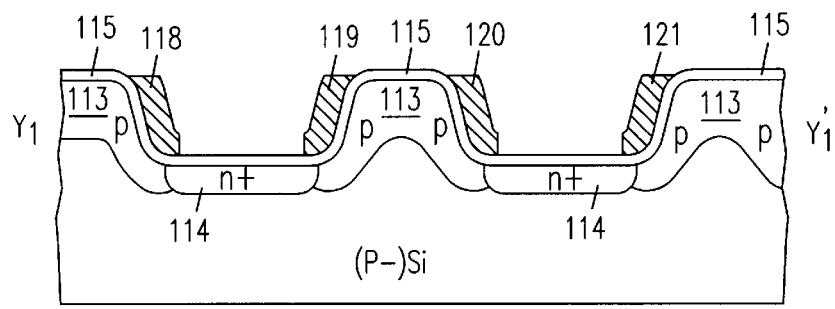

FIG. 22 is a simplified top-down diagram of the resulting structure having two horizontally extending depressions 116 and 117. Polysilicon strips 118 and 119 are disposed on the tunnel oxide over and along the steep sidewalls of the upper and lower steep sidewalls of upper depression 116, respectively. Polysilicon strips 120 and 121 are disposed on the tunnel oxide over and along the steep sidewalls of the upper and lower steep sidewalls of lower depression 117, respectively. FIGS. 23–25 are cross-sectional diagrams taken along lines $x_3$-$x_3'$, $y_2$-$y_2'$ and $y_1$-$y_1'$ of FIG. 22, respectively. Note that the P type dopants from regions 113 have expanded by diffusion.

Figure 26:
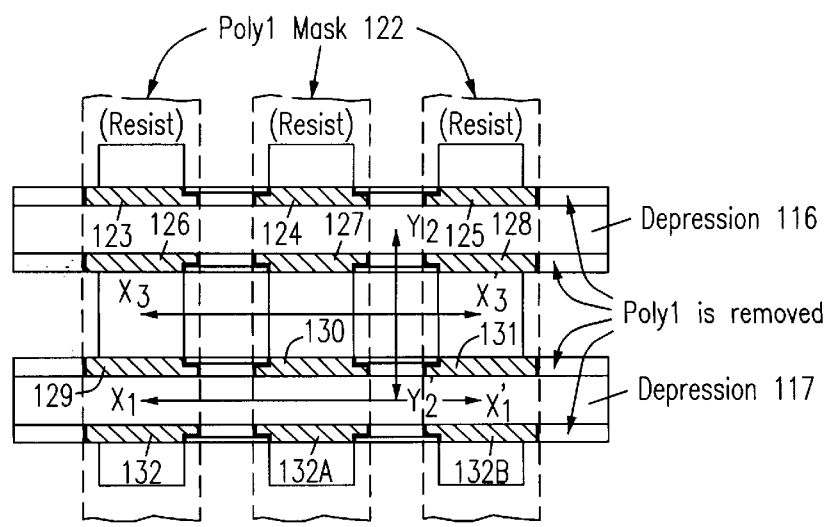
Figure 27:
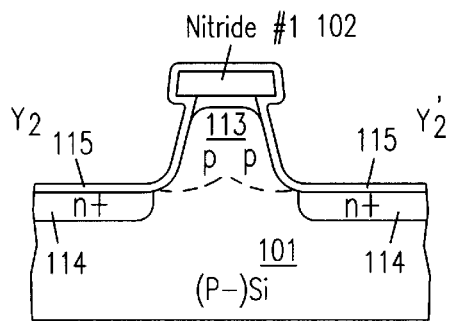

A photoresist polysilicon mask 122 is then formed as illustrated in FIG. 26 and a polysilicon etching performed so that individual floating gates 123–132, 132A and 132B of polysilicon remain over the steep sidewalls of the depressions. A wet polysilicon etch is preferred. FIG. 27 is a cross-sectional diagram taken along line $y_2$-$y_2'$ of FIG. 26 showing the removal of polysilicon from the steep sidewall between floating gates.

Figure 28:
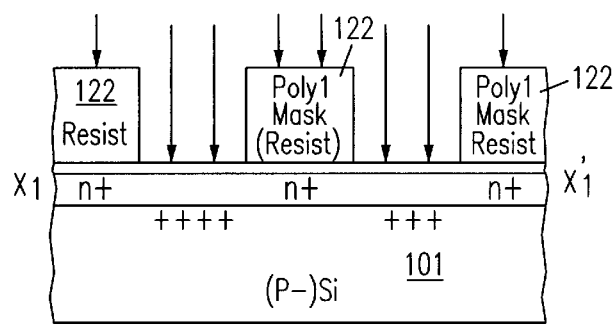
Figure 29:
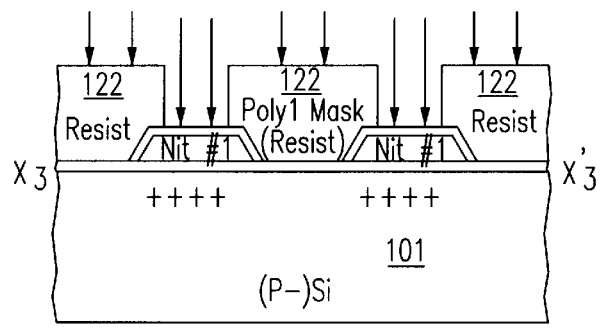

After the polysilicon etch, P type dopants are implanted in a core isolation implant step as illustrated in FIGS. 28 and 29 using the polysilicon mask 122. Boron may be implanted with a dose in the range of approximately 5E12 atoms/cm² to 5E14 atoms/cm² with an implant energy in the range of approximately 10–100 KeV. In a preferred embodiment, a dose of approximately 5E13 atoms/cm² of boron is implanted with an implant energy of approximately 30 KeV. After the polysilicon etch step, the polysilicon mask 122 is removed.

Next, an interpolydielectric formation step is performed. In some embodiments, all exposed silicon surfaces including the polysilicon floating gates are oxidized to form an overlying oxide layer. A first oxide layer is then deposited over the entire structure, a nitride layer is then deposited over the first oxide layer, and a second oxide is deposited over the nitride layer to form an ONO insulator structure. Subsequently, a gate oxidation step is performed to form an additional oxide layer having a thickness in the range of approximately 50–200 angstroms. In a preferred embodiment, about 2–100 angstroms of this additional gate oxide is formed. These insulator layers are hereafter referred to together as insulator layer 133.

With insulator layer 133 covering the floating gates, a conductive layer of polysilicon is deposited over the entire structure. This polysilicon layer can have a thickness in the range of approximately 500 to 3000 angstroms and preferably has a thickness of approximately 1000 angstroms. In some embodiments, polycide may be used rather than mere polysilicon.

Figure 30:
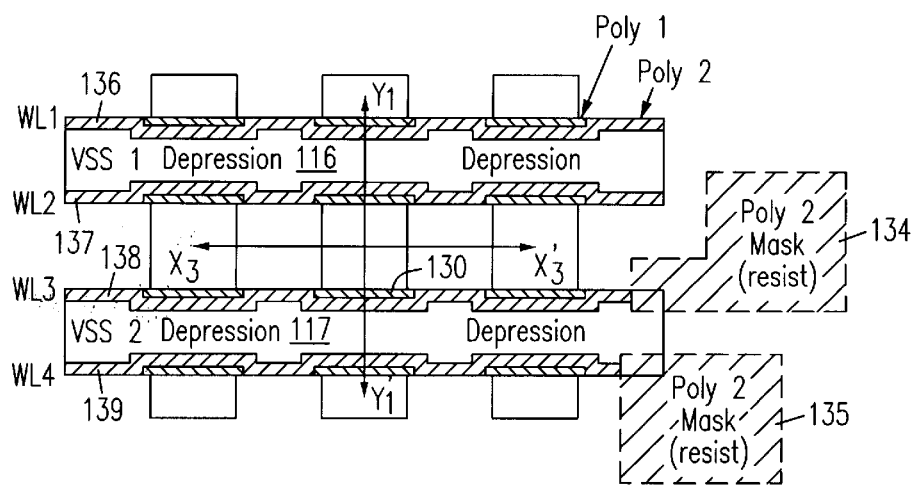
Figure 31:
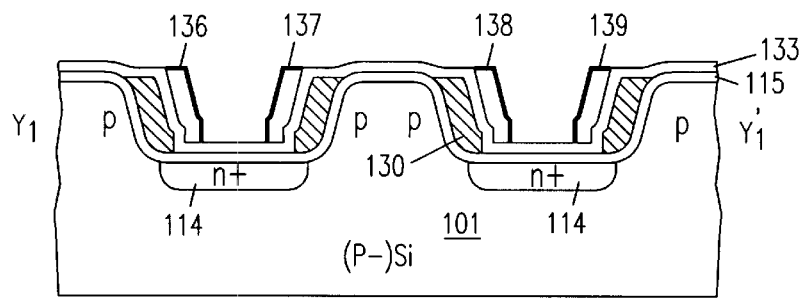
Figure 32:
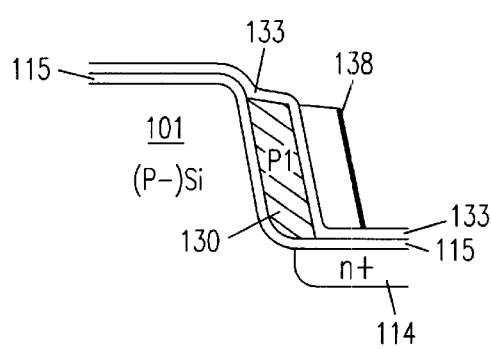

After the deposition of the polysilicon conductive layer over the insulator layer 133, a second polysilicon mask of photoresist is formed. As illustrated in FIG. 30, pad portions 134 and 135 of polysilicon are masked to form pads. A polysilicon etch is then performed. The result is that each steep sidewall has a polysilicon strip disposed over and along it (the polysilicon strip is of course separated from the sidewall by insulator layer 133). Polysilicon strips 136 and 137 are disposed over and along the steep sidewalls of upper depression 116 whereas polysilicon strips 138 and 139 are disposed over and along the steep sidewalls of lower depression 117. FIG. 31 is a simplified cross-sectional diagram taken along line $y_1$-$y_1'$ of FIG. 30. FIG. 32 is an expanded view of polysilicon floating gate 130 and overlying polysilicon strip 138 over a steep sidewall of depression 117.

Figure 33:
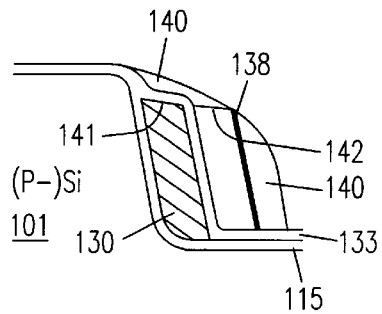

In an optional next step, oxide spacers are formed to cover the top side-edges of the floating gate and the conductive strips. FIG. 33 is a cross-sectional diagram illustrating one such oxide spacer 140 which covers upper side-edge 141 of floating gate 130 and upper side-edge 142 of conductive strip 138. The oxide spacers can be formed by depositing approximately 500 to 3000 angstroms of oxide using LTO or TEOS deposition and then etching the oxide into spacers.

An implant oxidation layer is then formed in the areas not covered by the oxide spacers and a source/drain implant step is performed. In some embodiments, arsenic is implanted with a dose in the range of approximately 1E15 atoms/cm² to 1E16 atoms/cm² with an implant energy in the range of approximately 20–100 KeV. In a preferred embodiment, arsenic is implanted with a dose of 5E15 atoms/cm² with an implant energy of approximately 60 KeV. The oxide spacers protect the upper portions of the tunnel oxide 115, floating gates 126–132B, insulator layer 133, and/or conductive strips 136–139 around upper side-edges 140 and 142 from damage during this implanting step.

Figure 34:
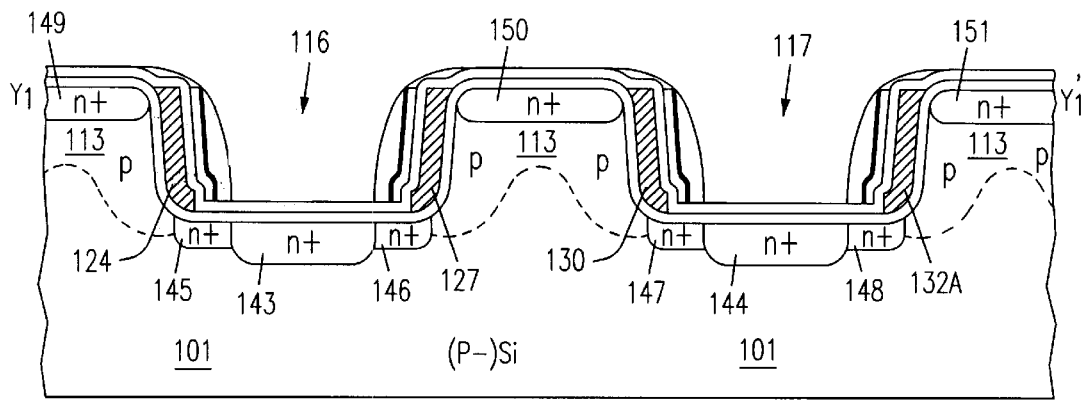

FIG. 34 is a cross-sectional diagram taken along line $y_1$-$y_1'$ of FIG. 30 after the source/drain implant step. Relatively deep N+ type regions 143 and 144 are formed into semiconductor material 101 in the bottom of depressions 116 and 117, respectively. Relatively shallow N+ type regions 145 and 146 which are masked from the source/drain implant are therefore formed along the edges of deep region 143 and relatively shallow N+ type regions 147 and 148 which are masked from the source/drain implant are therefore formed along the edges of deep region 144. A relatively deep N+ type region is formed between each adjacent pair of depressions. N+ type regions 149–151 are such N+ type regions. After the source/drain implant, the implanted dopants are activated in a source/drain anneal step. In some embodiments, the anneal may be carried out in nitrogen or argon for approximately 15 minutes at approximately 900° C.

Figure 35:
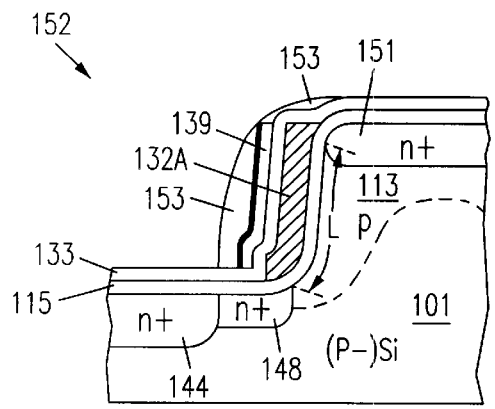

FIG. 35 is an expanded and simplified cross-sectional diagram of a bit transistor 152 of the structure illustrated in FIG. 34. Oxide spacer 153 is similar to oxide spacer 140 of FIG. 33. The distance "L" in FIG. 35 is the length of the channel region (i.e., "gate length") of the bit transistor 152 having floating gate 132A. Region 144 is generally more heavily doped than region 148.

Figure 36:
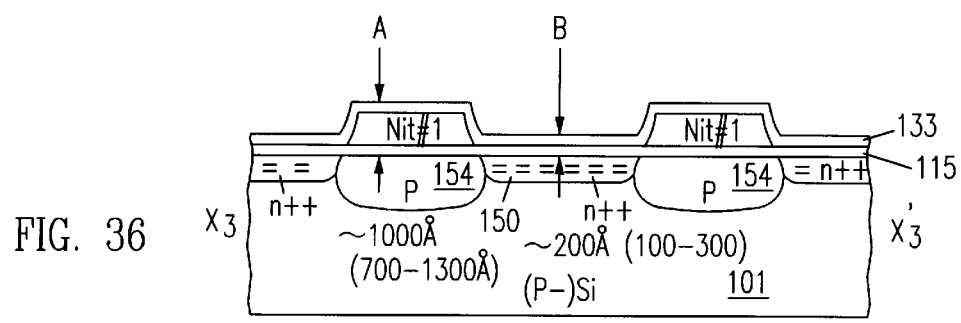

FIG. 36 is a cross-sectional diagram taken along line $x_3$-$x_3'$ of FIG. 30 after the source/drain implant step. Distance A is approximately 1000 angstroms or greater (in a range of approximately 700 to 1300 angstroms) to prevent the source/drain implant from counterdoping P type regions 154 formed during the step illustrated in FIG. 29. Distance B is approximately 200 angstroms or less (in a range of approximately 100 to 300 angstroms) so that region 150 will be implanted during the source/drain implant step.

After the anneal step, an overlying insulator layer is formed over the entire structure, contact openings are formed down to the N+ type regions 149–151 between depressions and down to the pad portions 134 and 135 of polysilicon. Overlying metal interconnect lines are then formed over the insulator layer to make contact to the underlying structure where appropriate through the contact openings.

Figure 37:
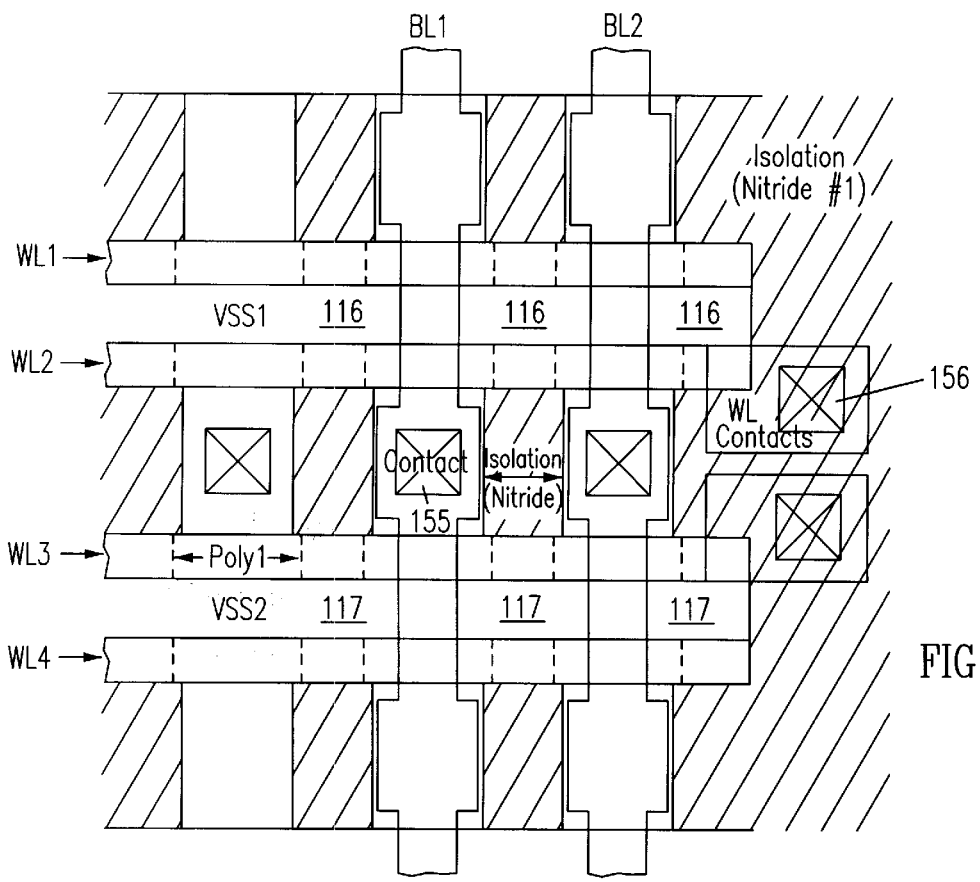

FIG. 37 is a simplified top-down diagram showing metal bit lines BL1 and BL2 extending in the vertical dimension over the horizontally extending depressions 116 and 117. Portions of the memory structure are omitted to simplify the illustration. Contact 155, for example, couples N+ type region 150 of FIG. 34 to bit line BL1. Similar contacts are provided for the other bit lines. A contact is provided on each bit line in the space between each consecutive pair of adjacent depressions. As shown in both FIGS. 30 and 37, horizontally extending conductive strip 137 is word line WL2. Contact 156 provides access to word line WL2 in depression 116. Each word line has a similar contact. The N+ type regions 143 and 144 in the bottom of depressions 116 and 117 are coupled together by metal (not shown) and associated contacts (not shown).

Figure 38:
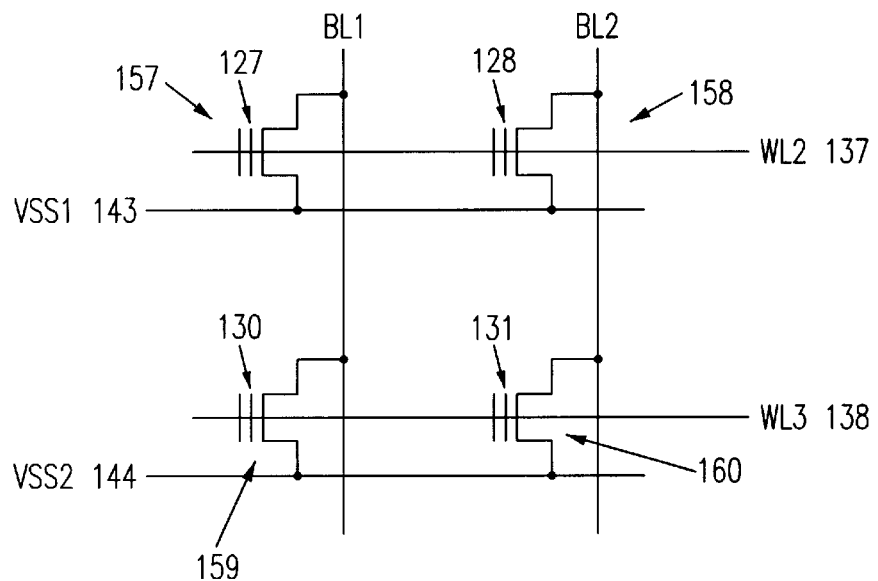

FIG. 38 is a simplified circuit diagram in accordance with the present invention. The upper word including bit transistors 157 and 158 is read by driving the word line WL2 of the selected word with a relatively positive voltage (for example, 5.0 volts) and driving all other words lines with ground potential. If, for example, the floating gate 127 of bit transistor 157 were sufficiently discharged of electrons, then an adequately large electric field would be present on the channel region of bit transistor 157 that a conductive path would be formed from region 143 (see FIG. 34) in the bottom of depression 116, through N+ type region 146, through the conductive channel region in P type region 113, and to N+ type region 150. If, on the other hand, the floating gate 127 of bit transistor 157 were sufficiently charged with electrons, then bit transistor 157 would not be conductive and the conductive path would not be formed. Accordingly, each bit line is driven with a positive voltage (for example, 1.0 volts) and the current flowing through the bit line is sensed. If the bit line current is greater than a predetermined amount (for example, greater than 10 microamperes), then the corresponding bit transistor in the selected word is determined to be conductive (the floating gate is discharged). If, on the other hand, the bit line current is smaller than the predetermined amount (for example, less than 10 microamperes), then the corresponding bit transistor in the selected word is determined to be nonconductive (the floating gate is charged).

Because an adequately large electric field is not established in the channel regions of bit transistors 159 and 160 when the word line WL3 is grounded regardless of whether then floating gates 130 and 131 are discharged or charged, bit transistors 159 and 160 are nonconductive and do not contribute significantly to the bit line currents. In this way, one selected word of bits of information stored on the floating gates of the bit transistors is read out in the form of bit line currents on bit lines BL1 and BL2.

Flash Erasing

All the floating gates of the flash memory are discharged simultaneously by Fowler-Nordheim tunneling. If, for example, the floating gates 127, 128, 130 and 131 are to be discharged, then the voltage conditions of Table 1 below would be supplied to the memory structure.

TABLE 1

| CONDUCTOR | CONDITION |
| --- | --- |
| WL2 | −7 to −13 volts |
| WL3 | −7 to −13 volts |
| BL1 | floating |
| BL2 | floating |
| VSS1 | 5 volts |
| VSS2 | 5 volts |

Electrons tunnel from the floating gates 127 and 128 to VSS1 line 143 and from the floating gates 130 and 131 to VSS2 line 144. Typically all the words of bit transistors of a memory are discharged simultaneously (i.e., "erased"). Hence the term "flash" memory.

Selective Programming

To program the flash memory, the floating gates of elected bit transistors of a selected word are charged (i.e., "programmed") by hot electron injection. If, or example, the floating gate 127 of bit transistor 157 were to be charged but the floating gates of all the other bit transistors 158, 130 and 131 were to remain discharged, then the voltage conditions of Table 2 below would be supplied to the memory structure.

TABLE 2

| CONDUCTOR | CONDITION |
|---|---|
| WL2 137 | 8 to 12 volts |
| WL3 138 | 0 volts |
| BL1 | 4 to 7 volts |
| BL2 | 0 volts |
| VSS1 143 | 0 volts |
| VSS2 144 | 0 volts |

Energetic electrons are made to move from VSS1 line 143 toward bit line BL1 by the potential difference between the VSS1 line and the bit line BL1. The positive voltage on the word line WL2 above floating gate 127, however, attracts these energetic electrons (i.e., "hot" electrons) upward so that some of the energetic electrons are redirected up into the floating gate 127 and become trapped in the floating gate 127. Accordingly, the floating gate of bit transistor 157 is charged with electrons but the floating gates of bit transistors 158, 159 and 160 are not.

Alternative Structure

Figure 39:
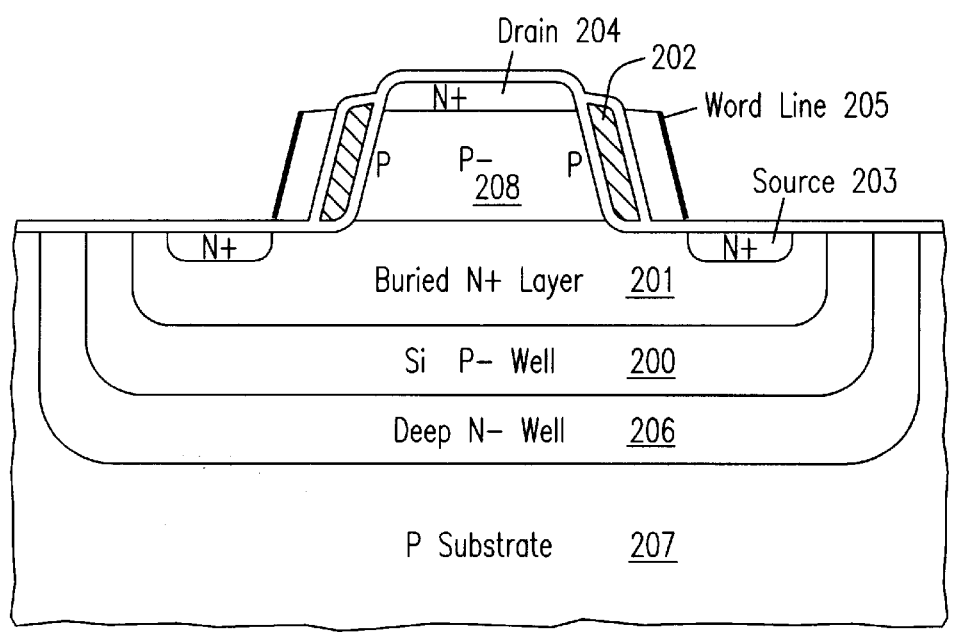
FIG. 39 is a cross-sectional diagram of another memory structure in accordance with the present invention.

FIG. 39 is a simplified cross-sectional diagram of an alternative structure in accordance with another embodiment of the present invention. A P– well 200 is disposed inside a deep N– well 206 to isolate an N+ buried layer 201 from the substrate 207. Fowler-Nordheim tunneling is used both for charging floating gates and for discharging floating gates.

Flash Erasing of the Alternative Structure

All the bit transistors of the alternative structure are simultaneously charged (i.e., "erased"). To charge the floating gate 202 of the bit transistor of FIG. 39, the voltage conditions of Table 3 below are supplied.

TABLE 3

| CONDUCTOR | CONDITION |
|---|---|
| Source 203 | –5 to –10 volts |
| Drain 204 | floating |
| Word Line 205 | 5 to 10 volts |
| N+ Buried Layer 201 | –5 to –10 volts |
| P– Well 200 | –6 to –11 volts |
| Deep N– Well 206 | 0 volts |

Electrons tunnel from the buried N+ layer 201 and/or the source region 203 to the floating gate 202. The PN junction between P– well 200 and N+ buried layer 201 is reverse biased as is the PN junction between P– well 200 and deep N– well 206.

Selective Programming of the Alternative Structure

To discharge the bit transistor of FIG. 39, the voltage conditions of Table 4 below are supplied.

TABLE 4

| CONDUCTOR | CONDITION |
|---|---|
| Source 203 | floating |
| Drain 204 | 5 volts |
| Word Line 205 | –7 to –13 volts |
| N+ Buried Layer 201 | grounded or floating |
| P– Well 200 | 0 volts |
| Deep N– Well 206 | 0 volts |

P– island 208 is floating in some embodiments and is grounded in other embodiments. Electrons tunnel from the floating gate 202 to the drain region 204. In some embodiments, the structure of FIG. 39 is fabricated in accordance with the above-described fabrication method by: 1) forming the N+ buried layer 201 before the thin nitride layer 102 is deposited, 2) omitting the thick oxide etch back step and the VSS source implant step (see FIGS. 17 and 18), and 3) performing the optional source/drain implant step (see FIG. 16) after the nitride etch step and before the step of removing the remaining thick oxide (between FIGS. 18 and 19). The N+ buried layer 201 is formed by implanting arsenic or phosphorous with an implant energy in a range of approximately 400–800 KeV and a preferred implant energy of approximately 600 KeV. With doubly ionized dopants, approximately 300 KeV is used. The implant energy of the N+ buried layer implant is reduced to about 60 KeV.

Although the present invention is described in connection with certain specific embodiments for instructional purposes, the present invention is not limited thereto. The terms vertical and horizontal (lateral) are relative to one another and are otherwise not limiting. P and N type conductivities may be reversed so that either N-channel or P-channel devices may be realized. Techniques of forming a depression or step other than using thin and thick nitride layers to control bird's beak profile may be employed. Accordingly, various modifications, adaptations, and combinations of various structures and steps of the described embodiments can be practiced without departing from the scope of the invention as set forth in the following claims.

What is claimed is:

1. A memory structure comprising:
   a semiconductor material having an upper surface, said upper surface comprising a first substantially lateral and planar surface, a sidewall surface, and a second substantially lateral and planar surface, said first surface being laterally and vertically displaced with respect to said second surface, the semiconductor material at said sidewall surface being substantially free of ion impact damage;
   a source region extending into said semiconductor material from said first surface;
   a drain region extending into said semiconductor material from said second surface;
   a first layer of insulator material disposed on said sidewall surface;
   a floating gate disposed on said first layer of insulator material;
   a second layer of insulator material disposed on said floating gate; and
   a conductive layer disposed on said second layer of insulator material, said second layer of insulator material separating said floating gate and said conductive layer.

2. The memory structure of claim 1, wherein said conductive layer is a word line extending along said sidewall surface in a first dimension, said memory structure further comprising:
   a bit line extending in a second dimension substantially perpendicular to said first dimension, said bit line being coupled to said drain region.

3. The memory structure of claim 2, wherein said floating gate is a layer of polysilicon.

4. The memory structure of claim 3, wherein said word line comprises polysilicon.

5. The memory structure of claim 3, wherein said second layer of insulator material comprises a first layer of oxide, a layer of nitride, and a second layer of oxide.

6. A memory structure comprising:

a semiconductor material of a first conductivity type having an upper surface, said upper surface having first and second elongated depressions which extend in a first dimension, each of said elongated depressions having opposing steep sidewalls and a bottom surface, the semiconductor material at said steep sidewalls being substantially free of ion impact damage;

a first insulator layer disposed on said sidewalls of said first and second depressions;

a first plurality of strips of a conductive layer, a respective one each of said first plurality of strips extending in said first dimension over a respective one of said sidewalls and being insulated from said sidewalls;

a second plurality of strips of a conductive layer, each of said second plurality of strips extending substantially parallel to the others of said second plurality of strips and extending in a second dimension substantially perpendicular to said first dimension, each of said second plurality of strips crossing over said first plurality of strips and crossing over said first and second depressions;

a plurality of floating gates, a respective one of said floating gates being disposed near each respective location where one of said second plurality of strips crosses one of said first plurality of strips, each floating gate being disposed between one of said first plurality of strips and the sidewall over which said strip is disposed;

a second insulator layer, each floating gate being insulated from the one of said second plurality of strips which crosses over said each floating gate;

first and second elongated conductive regions of a second conductivity type opposite said first conductivity type, said first elongated conductive region extending into said bottom surface of said first depression, said second conductive region extending into said bottom surface of said second depression; and a plurality of third conductive regions of said second conductivity type extending into said semiconductor material between said first and second depressions, a respective one of said third conductive regions being disposed underneath and being coupled to a respective one of said second plurality of strips.

7. The memory structure of claim 6, wherein said plurality of floating gates are polysilicon gates, said first plurality of strips comprises polysilicon, said second plurality of strips are metal strips.

8. The memory structure of claim 7, wherein said first plurality of strips are word lines and wherein said second plurality of strips are bit lines.

9. The memory structure of claim 6, wherein said elongated depressions have opposing gradually sloping sidewalls in addition to said steep sidewalls.

10. The memory structure of claim 6, further comprising:

a plurality of oxide spacers, part of said oxide spacers being disposed on side-edges of said floating gates and on side-edges of said first plurality of strips.

11. The memory structure of claim 6, wherein each of said first and second elongated conductive regions comprises:

a first relatively shallow region disposed under one of said first plurality of strips disposed over a sidewall of a depression;

a second relatively shallow region disposed under another of said first plurality of strips disposed over the opposing sidewall of said depression; and a relatively deep region disposed between said first and second relatively shallow regions and contacting said first and second relatively shallow regions.

* * * * *